United States Patent
Curtiss et al.

(10) Patent No.: US 11,696,058 B2
(45) Date of Patent: Jul. 4, 2023

(54) AUDIO DEVICE WITH SEALING MEMBER AND INTERNAL HEAT SINK

(71) Applicant: Bose Corporation, Framingham, MA (US)

(72) Inventors: Eric Douglas Curtiss, East Boston, MA (US); Karl Edward Jacobson, Hubbardston, MA (US); Colin Taylor Mosgrove, Needham, MA (US); Brenton Harry Eva, Fayette, ME (US)

(73) Assignee: Bose Corporation, Framingham, MA (US)

(*) Notice: Subject to any disclaimer, the term of this patent is extended or adjusted under 35 U.S.C. 154(b) by 91 days.

(21) Appl. No.: 16/953,763

(22) Filed: Nov. 20, 2020

(65) Prior Publication Data
US 2021/0076114 A1    Mar. 11, 2021

Related U.S. Application Data

(63) Continuation of application No. 16/220,024, filed on Dec. 14, 2018, now Pat. No. 10,880,628.

(51) Int. Cl.
| | | |
|---|---|---|
| H04R 25/00 | (2006.01) | |
| H04R 1/02 | (2006.01) | |
| H04R 1/04 | (2006.01) | |
| H04R 9/02 | (2006.01) | |
| H05K 1/02 | (2006.01) | |

(52) U.S. Cl.
CPC .............. *H04R 1/025* (2013.01); *H04R 1/04* (2013.01); *H04R 9/022* (2013.01); *H05K 1/0213* (2013.01)

(58) Field of Classification Search
CPC ........ H04R 1/323; H04R 1/021; H04R 1/345; H04R 9/022
See application file for complete search history.

(56) References Cited

U.S. PATENT DOCUMENTS

| | | |
|---|---|---|
| 6,626,263 B2 | 9/2003 | Sahyoun |
| 9,721,586 B1 | 8/2017 | Bay et al. |
| 10,306,356 B2 | 5/2019 | Katz ...................... H04R 1/323 |
| 10,375,471 B2 | 8/2019 | Johnson ................. H04R 1/345 |
| 2013/0294638 A1 | 11/2013 | Huseby et al. |

(Continued)

FOREIGN PATENT DOCUMENTS

| | | |
|---|---|---|
| CN | 204906676 U | 12/2015 |
| CN | 105704615 A | 6/2016 |

(Continued)

OTHER PUBLICATIONS

PCT International Search Report and Written Opinion for International Application No. PCT/US20191066186, dated Jun. 19, 2020, 18 pages.

(Continued)

*Primary Examiner* — Amir H Etesam
(74) *Attorney, Agent, or Firm* — Hoffman Warnick

(57) ABSTRACT

Various implementations include audio devices and components of such devices. Certain implementations include an audio device with a sealing member for providing a substantially water resistant seal. Certain additional implementations include an audio device with an internal heat sink for transferring heat away from device components such as a control module.

20 Claims, 6 Drawing Sheets

(56) References Cited

U.S. PATENT DOCUMENTS

2014/0294216 A1* 10/2014 Teng .................. H04R 1/025
                                                        381/334
2014/0294217 A1    10/2014 Yamaguchi et al.
2018/0288525 A1    10/2018 Katz et al.

FOREIGN PATENT DOCUMENTS

CN    205847489 U    12/2016
CN    208063379 U    11/2018

OTHER PUBLICATIONS

Image taken from an internal section of the Sonos Beam Soundbar product, taken on Dec. 12, 2018. Additional product information available at: https://www.sonos.com/en-us/shop/beam.html.

* cited by examiner

AUDIO DEVICE WITH SEALING MEMBER AND INTERNAL HEAT SINK

PRIORITY CLAIM

This application is a continuation application of U.S. patent application Ser. No. 16/220,024, filed on Dec. 14, 2018, which is hereby incorporated by reference in its entirety.

TECHNICAL FIELD

This disclosure generally relates to audio devices. More particularly, the disclosure relates to an audio device having a sealing member and a heat sink internal to the device body.

BACKGROUND

There is a growing demand for audio devices, such as portable audio devices, with increased capabilities. However, as device capabilities increase, it becomes more difficult to effectively transfer heat away from electronic components in these devices. Additionally, it is difficult to design environmental protection for many portable devices without sacrificing one or more performance capabilities.

SUMMARY

All examples and features mentioned below can be combined in any technically possible way.

Various implementations include audio devices and components of such devices. Certain implementations include an audio device with a sealing member for providing a substantially water resistant seal. Certain additional implementations include an audio device with an internal heat sink for transferring heat away from device components such as a control module.

In particular aspects, an audio device includes: a main body defining an acoustic enclosure, the main body having a slot extending around an external surface thereof; a cap overlying the main body; and a sealing member extending entirely around the external surface of the main body in the slot, the sealing member providing a substantially water resistant seal between the main body and the cap.

In additional particular aspects, an audio device includes: a main body defining: an acoustic enclosure, and an electronics compartment over the acoustic enclosure; a control module in the electronics compartment; a set of passive radiators sealing a lower portion of the acoustic enclosure; and a heat sink sealing an upper end of the acoustic enclosure.

In further particular aspects, an audio device includes: a main body defining: an acoustic enclosure, and an electronics compartment over the acoustic enclosure, wherein the main body comprises a slot extending around an external surface thereof; a sealing member extending entirely around the external surface of the main body in the slot; a control module in the electronics compartment; a set of passive radiators sealing a lower portion of the acoustic enclosure; and a heat sink sealing an upper end of the acoustic enclosure.

In additional particular aspects, an audio device includes: a main body defining an acoustic enclosure, the main body having a slot extending circumferentially around an external surface thereof; a cap overlying the main body; and a sealing member extending entirely around the external surface of the main body in the slot, the sealing member providing a substantially water resistant seal between the main body and the cap, where the sealing member aligns the cap with the main body, and where the sealing member provides impact protection for components housed in the main body.

In further particular aspects, an audio device includes: a main body defining: an acoustic enclosure, and an electronics compartment over the acoustic enclosure, the main body having a slot extending around an external surface thereof; a cap overlying the main body; and a sealing member extending entirely around the external surface of the main body in the slot, the sealing member providing a substantially water resistant seal between the main body and the cap, where the sealing member contacts an inner surface of the cap.

Implementations may include one of the following features, or any combination thereof.

In some cases, the cap is coupled with the main body by at least one snap-fit coupling, and the sealing member dampens a load on the at least one snap-fit coupling.

In particular aspects, the slot extends circumferentially about the external surface of the main body, and the sealing member includes an O-ring sized to fill the slot.

In certain implementations, the acoustic enclosure is sealed at a lower end by a transducer, is sealed at a lower portion by a set of passive radiators and is sealed at an upper end by a heat sink.

In some aspects, the audio device further includes at least one microphone mounted in the main body above the heat sink, where the sealing member acoustically isolates the at least one microphone from the transducer and the set of passive radiators.

In particular cases, the sealing member aligns the cap with the main body, and the substantially water resistant seal is capable of achieving at least IPX7 liquid ingress protection.

In certain aspects, the sealing member provides impact protection for components housed in the main body.

In particular aspects, the heat sink is configured to transfer heat away from the control module to the acoustic enclosure.

In some cases, during operation of the acoustic device, air moved by the set of passive radiators within the acoustic enclosure aids in the transfer of heat away from the control module.

In certain implementations, the main body includes a slot between the acoustic enclosure and the electronics compartment, and the heat sink is located below the control module within the slot.

In some aspects, the audio device further includes: a cover surrounding the control module; and a thermal interface material between the cover and the heat sink.

In particular cases, the audio device further includes a plastic casing surrounding the heat sink, where the heat sink includes metal.

In certain implementations, the heat sink extends laterally to a cavity in the main body for transferring a portion of the heat from the control module to the cavity.

In some aspects, the acoustic device includes a portable acoustic device, and the control module includes a chipset configured for both Wi-Fi communication and Bluetooth communication.

In particular aspects, the audio device further includes a printed circuit board over the control module.

In certain cases, the acoustic enclosure is airtight.

Two or more features described in this disclosure, including those described in this summary section, may be combined to form implementations not specifically described herein.

The details of one or more implementations are set forth in the accompanying drawings and the description below. Other features, objects and benefits will be apparent from the description and drawings, and from the claims.

Figure 1:
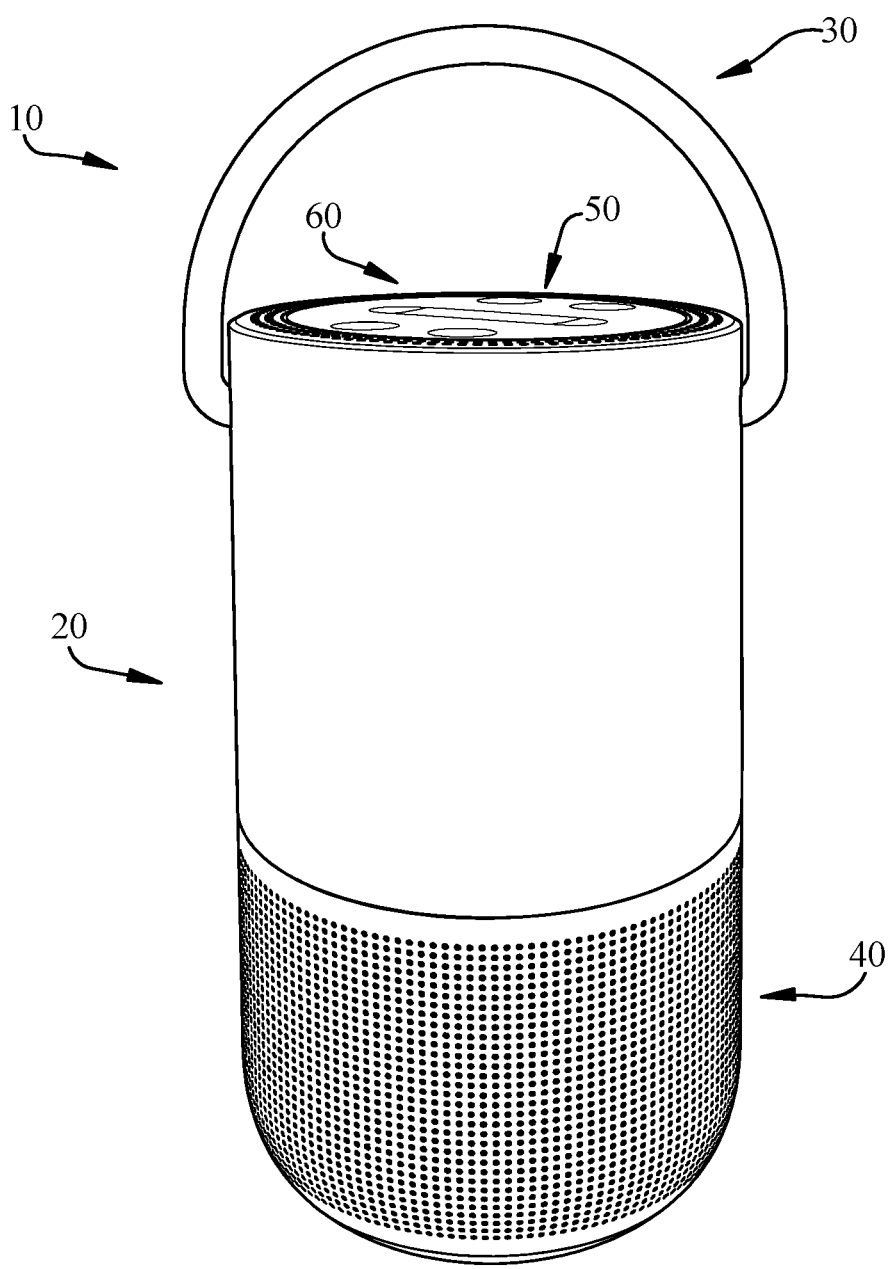
FIG. 1 shows a side perspective view of an audio device according to various implementations.

It is noted that the drawings of the various implementations are not necessarily to scale. The drawings are intended to depict only typical aspects of the disclosure, and therefore should not be considered as limiting the scope of the implementations. In the drawings, like numbering represents like elements between the drawings.

DETAILED DESCRIPTION

This disclosure is based, at least in part, on the realization that a sealing member can be beneficially incorporated into an audio device. This disclosure is also based, at least in part, on the realization that an internal heat sink can be beneficially incorporate into an audio device. The sealing member can provide environmental and impact protection as well as enhance acoustic performance. The internal heat sink can enhance device performance and usable life without sacrificing acoustic performance.

Commonly labeled components in the FIGURES are considered to be substantially equivalent components for the purposes of illustration, and redundant discussion of those components is omitted for clarity.

As described herein, it becomes more difficult to effectively transfer heat away from electronic components in audio devices as these device capabilities increase. For example, as portable audio devices increase communications and connectivity capabilities, transferring heat from electronic components in these devices is increasingly important. Additionally, as noted herein, it is difficult to design environmental and impact protection for many portable devices without sacrificing one or more performance capabilities. In contrast to conventional audio devices, various implementations have an internal heat sink that is configured to seal an acoustic enclosure and transfer heat from a control module. Additionally, in contrast to conventional audio devices, various implementations include a sealing member that provides a substantially water resistant seal between the main body and the cap of the audio device. The sealing member can also provide impact protection and acoustic isolation for the audio device, enhancing useful life and improving device performance.

FIG. 1 shows a side perspective view of an audio device 10 according to various implementations. In some cases, the audio device 10 includes a portable audio device such as a tabletop or handheld speaker that has capability for both hard-wired and battery powered operation. The audio device 10 has a base 20, and in this example implementation, a handle 30 connected with the base 20 (for example, to enable transport of the audio device 10). The base 20 can contain speaker components such as one or more transducers, resonators, digital signal processors (DSPs) and related control circuitry, as described herein. The base 20 can also include a speaker grille 40, which is shown in the example depiction in FIG. 1 as extending around the lower portion of the base 20. In some cases, the base 20 includes a keypad 50 located on its upper face 60, for actuating functions of the audio device 10, e.g., playback functions, volume control, device pairing, etc. In some cases, the keypad 50 can include a light ring extending around the face 60.

Figure 2:
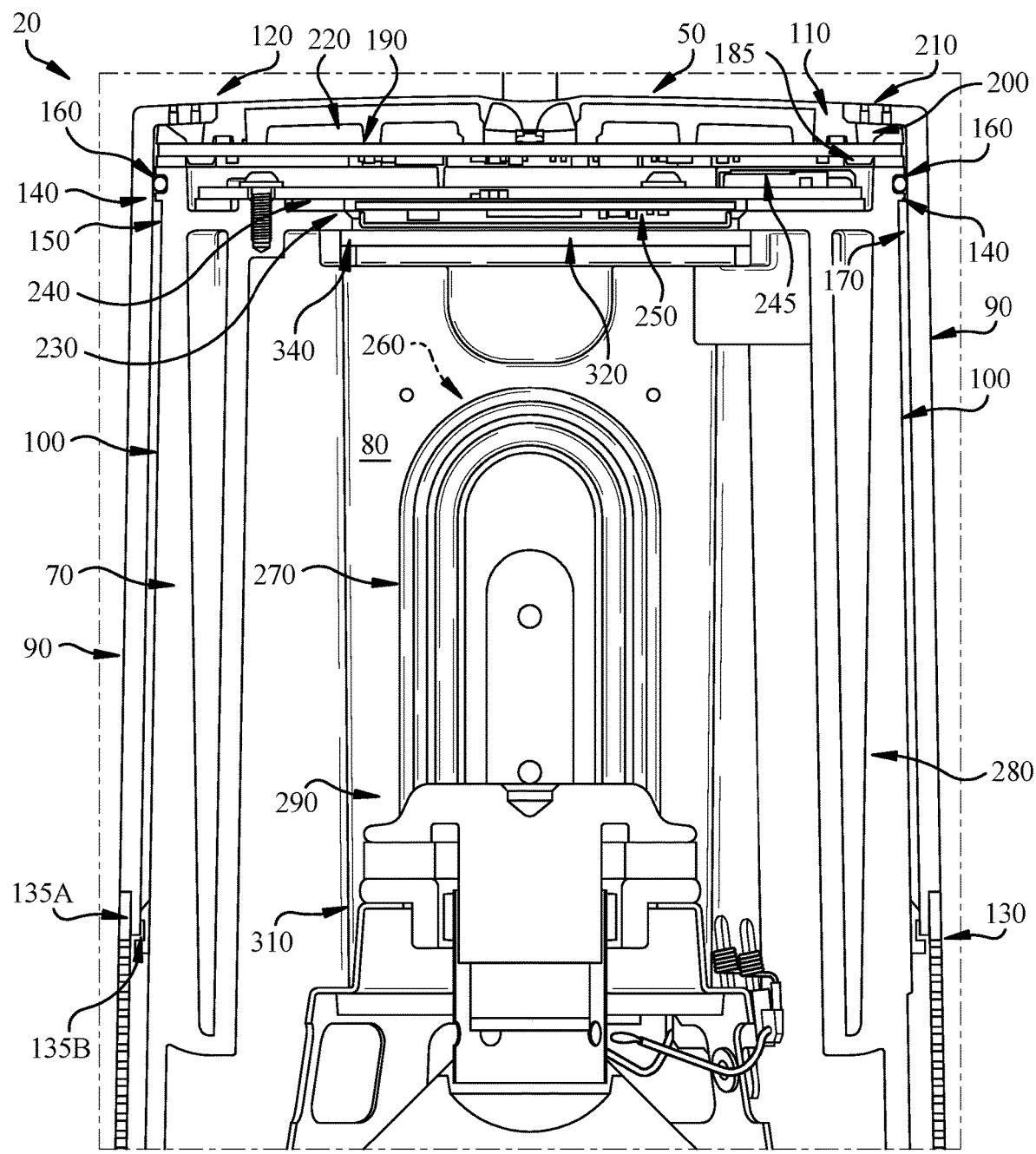
FIG. 2 shows a cross-sectional view of the base of the audio device of FIG. 1, according to various implementations.
Figure 3:
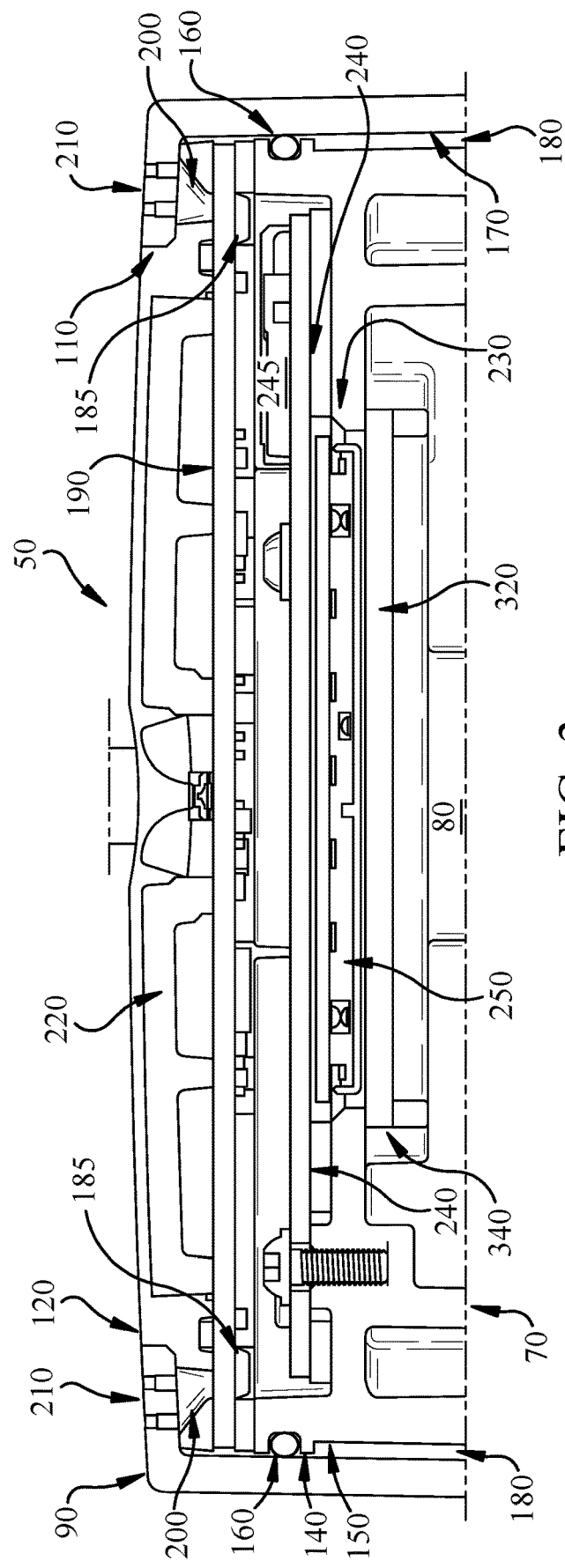
FIG. 3 shows a portion of the cross-section of the base of the audio device of FIG. 2.

FIG. 2 shows a cross-sectional view of the base 20 of the audio device 10 according to various implementations. FIG. 3 shows a portion of the cross-section of the base 20 in FIG. 2. As shown in these FIGURES, with particular clarity in FIG. 2, the base 20 of the audio device 10 can include a main body 70 that defines an acoustic enclosure 80. The acoustic enclosure 80 is discussed in greater detail with reference to additional features of the audio device 10. The main body 70 can be formed of a metal, plastic or composite material that is molded, three-dimensionally printed or otherwise conventionally manufactured to take the shape illustrated herein.

FIGS. 2 and 3 also illustrate a cap 90 overlying the main body 70. As with the main body 70, the cap 90 can be formed of a metal, plastic or composite material that is molded, three-dimensionally printed or otherwise conventionally manufactured to take the shape illustrated herein. The cap 90 is sized to fit snugly (i.e., conformingly) over the main body 70 and couple with the main body 70, as described herein.

In some particular implementations, the cap 90 covers a portion of the main body 70, e.g., along the sidewall 100 of the main body 70 and over a portion 110 of the upper surface 120 of the main body 70. In some cases, the cap 90 extends along the sidewall 100 of the main body 70 at least a portion of the axial length of the acoustic enclosure 80. In particular implementations, the cap 90 extends along the sidewall 100 and is coupled with the main body 70 by at least one snap-fit coupling (e.g., a male/female snap coupling) 130 (FIG. 2). In some example cases, the snap-fit couplings 130 include a male coupling 135A on the main body 70 and a female coupling 135B on the cap 90, or vice versa.

Figure 4:
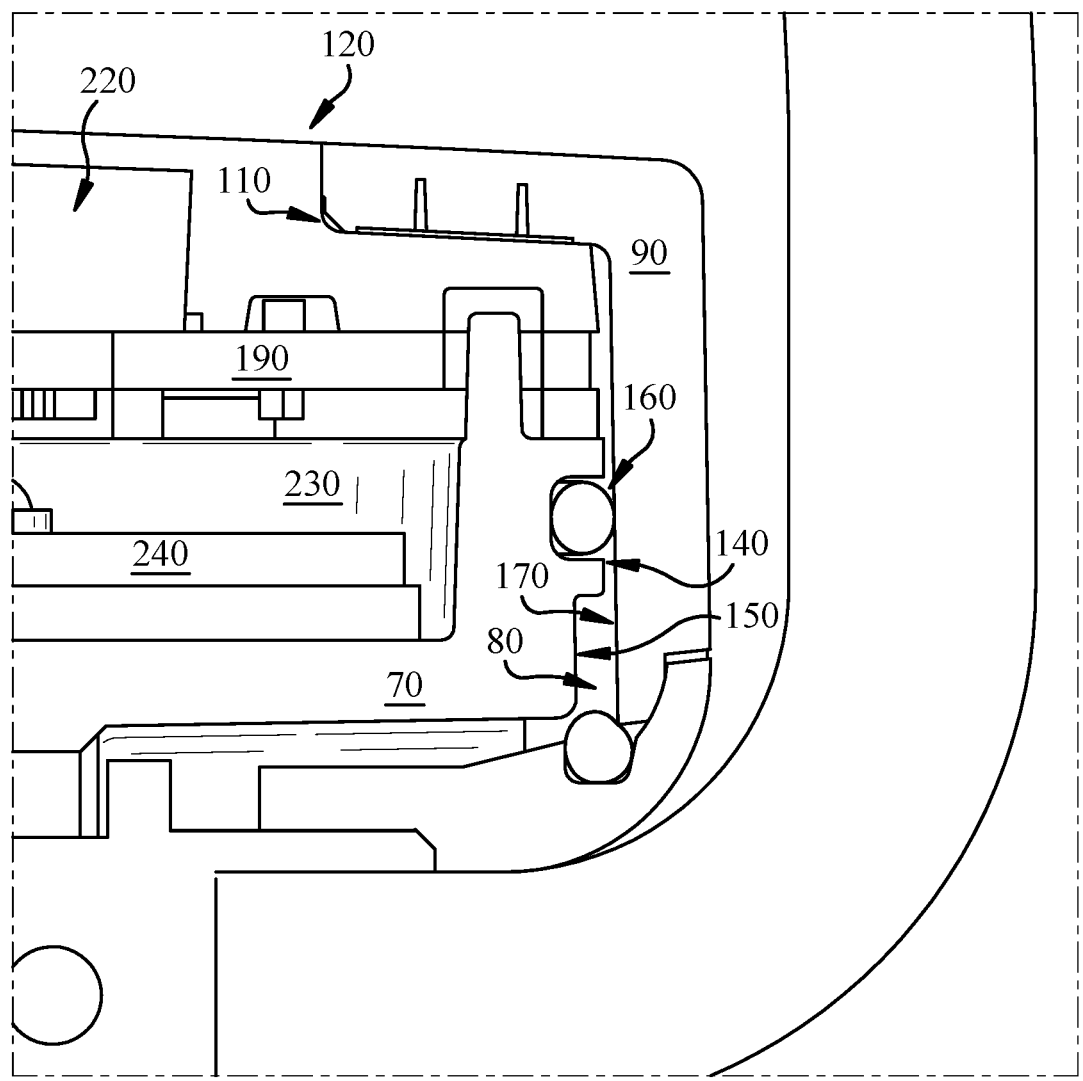
FIG. 4 shows a close-up cross-section of the interface between the main body and the cap of the audio device illustrated in FIG. 3.

FIGS. 2 and 3 both illustrate a slot 140 that extends around an external surface 150 of the main body 70 (e.g., around sidewall 100). The slot 140 is particularly evident in FIG. 3. In various implementations, the slot 140 extends circumferentially about the external surface 150 of the main body 70. According to certain implementations, the slot 140 extends circumferentially about the entirety of the external surface 150 of the main body 70, forming a continuous pathway. FIG. 4 shows a close-up additional cross-section of the interface between the main body 70 and the cap 90, which illustrates the slot 140 in greater detail.

With continuing reference to FIGS. 3 and 4, the audio device 10 can further include a sealing member 160 extending entirely around the external surface 150 of the main body 70 in the slot 140. That is, the sealing member 160 is configured to reside (e.g., rest) in the slot 140 and extend entirely around the external surface 150 of the main body 70. In particular cases, the sealing member 160 includes a gasket, a flexible wiper, foam, a silicon-based component and/or an adhesive. Regardless of material type, the sealing member 160 can be sized to fill or substantially fill the slot 140 in order to provide a seal, as described herein. In some particular cases, the sealing member 160 includes an O-ring sized to fill the slot 140. In certain cases, the O-ring can provide a relatively inexpensive yet effective radial seal around the external surface 150 of the main body 70.

The sealing member 160 can also be sized, such that when the cap 90 is placed on the main body 70, the sealing member 160 contacts the inner surface 170 of the cap 90. The sealing member 160 can be formed of rubber, plastic or a composite material capable of compressing and sealing a space 180 between the external surface 150 of the main body 80 and the inner surface 170 of the cap 90 adjacent the slot 140. In various implementations, the sealing member 160 can provide a substantially water resistant seal between the main body 70 and the cap 90, e.g., across this space 180. That is, the sealing member 160 is capable of compressing (flexing) when the cap 90 is mounted on the main body 70, thereby providing a seal between the main body 70 and the cap 90 that achieves at least IPX4 liquid ingress protection (as defined by International Protection Marking standards set forth by the International Electrotechnical Commission (IEC)). In these cases, the water resistant seal provides liquid ingress protection for the electronic components in the main body 70 from a splashed external liquid. In other particular cases, the sealing member 160 is capable of providing a seal between the main body 70 and the cap 90 that achieves at least IPX5 liquid ingress protection. In these cases, the water resistant seal provides liquid ingress protection for the electronic components in the main body 70 from a projected external liquid, such as water projected from a nozzle. In more particular cases, the sealing member 160 is capable of providing a seal between the main body 70 and the cap 90 that achieves at least IPX7 liquid ingress protection. In these cases, this water resistant seal can prevent external liquid seepage to the electronic components in the main body 70 for up to 30 minutes when the audio device 10 is immersed in one (1) meter or less of liquid (e.g., water).

Additionally, with particular reference to FIG. 2, when the main body 70 and the cap 90 are coupled (e.g., by one or more snap-fit couplings 130) the sealing member 160 can dampen a load on the snap-fit coupling(s) 130. That is, the sealing member 160 is positioned to contact both the main body 70 and the cap 90 when located in the slot 140. Because the snap-fit couplings 130 are fit under pressure (e.g., flexion), the sealing member 160 can dampen the load applied to respective snap-fit couplings 130. This may aid in extending the usable life of the main body 70 and/or cap 90.

In addition to reducing the load on the snap-fit couplings 130, the sealing member 160 can also be configured to align the cap 90 with the main body 70. That is, manufacturing variations in the cap 90 and/or the main body 70, wear-and-tear over time, and/or environmental conditions (e.g., humidity, temperature, etc.) can cause the cap 90 to align imperfectly with the main body 70. Because the audio device 10 is configured for portable use and for water resistance, it can be beneficial for the cap 90 to closely fit over the main body 70. The sealing member 160, which protrudes from the slot 140, can aid in aligning the cap 90 with the main body 70. That is, the sealing member 160 provides an additional contact point for the cap 90 to help stabilize the cap 90 in a desired position over the main body 70.

The sealing member 160 can also provide impact protection for components housed in the main body 70, e.g., one or more transducers, microphones, passive radiators, control circuitry (e.g., printed circuit board(s), or PCBs), etc. As noted herein, the sealing member 160 is formed of a compressible material such as a rubber, plastic or composite material, and is configured to flex when the cap 90 is fit over the main body 70. That is, the sealing member 160 can create a mass-spring system with the cap 90, such that when the cap 90 is impacted (e.g., by a fall or other blow), the sealing member 160 flexes to absorb at least a portion of that impact. The sealing member 160 thereby reduces the load carried by the cap 90 (and consequently, the main body 70) when such an impact occurs.

FIGS. 2 and 3 illustrate additional features of the audio device 10, including microphones 185 mounted to a base 190 of the keypad 50 (FIG. 1) in the main body 70. These microphones 185 can be mounted through slots in the base 190, and can be exposed to a microphone cavity 200 in the main body 70. The microphone cavity 200 connects with microphone openings 210 in the cap 90, when the cap 90 is coupled with the main body 70. The microphones 185 are configured to detect ambient acoustic signals proximate the audio device 10. In some cases, the microphones 185 are protected on their backside by a waterproof mesh. Overlying the base 190 of the keypad 50 is an interface 220, which can include one or more interface controls, such as actuatable buttons or touch screens for controlling functions of the audio device 10.

The audio device 10 can also include an electronics compartment 230 that overlies the acoustic enclosure 80, and underlies the base 190 of the keypad 50. The electronics compartment 230 can include a printed circuit board (PCB) 240 connected with the keypad 50 by one or more connectors 245. The PCB 240 is also coupled with a control module 250, which underlies the PCB 240. In various implementations, the control module 250 includes a chipset configured for both Wi-Fi communication and Bluetooth communication. That is, the control module 250 allows the audio device 10 to communicate with other devices in a network over Wi-Fi and/or directly communicate with other devices over Bluetooth connection (or any variation/version of Bluetooth, e.g., BLE). Many conventional audio devices (e.g., portable speakers) do not possess this communication capability. More particularly, many conventional audio devices are designed with Bluetooth connection capability, but not Wi-Fi connection capability. Due in part to its communication capability, the control module 250 in audio device 10 carries a significant heat load during operation.

Figure 5:
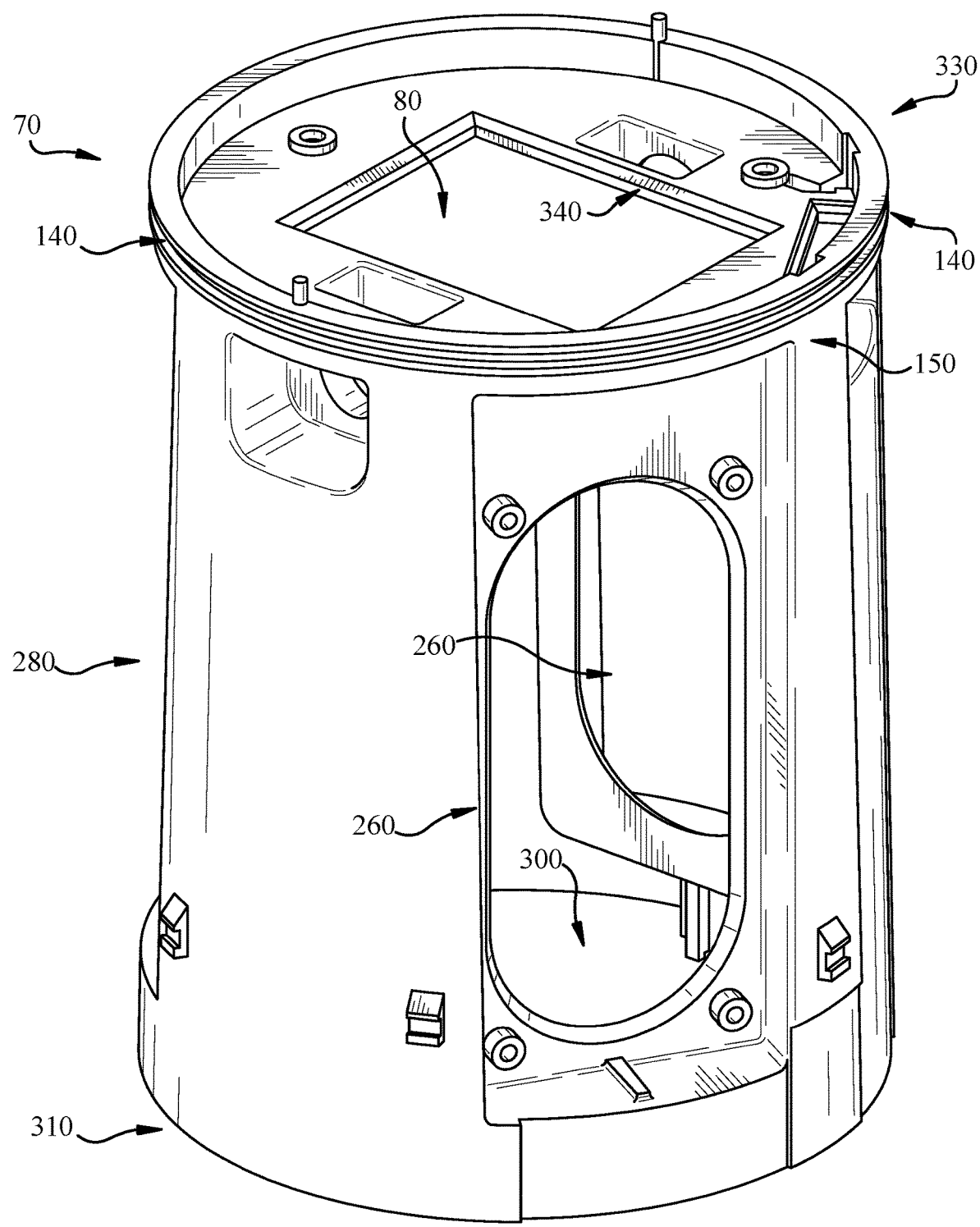
FIG. 5 shows a three-dimensional perspective view of the main body of the audio device in FIG. 1, in isolation.
Figure 6:
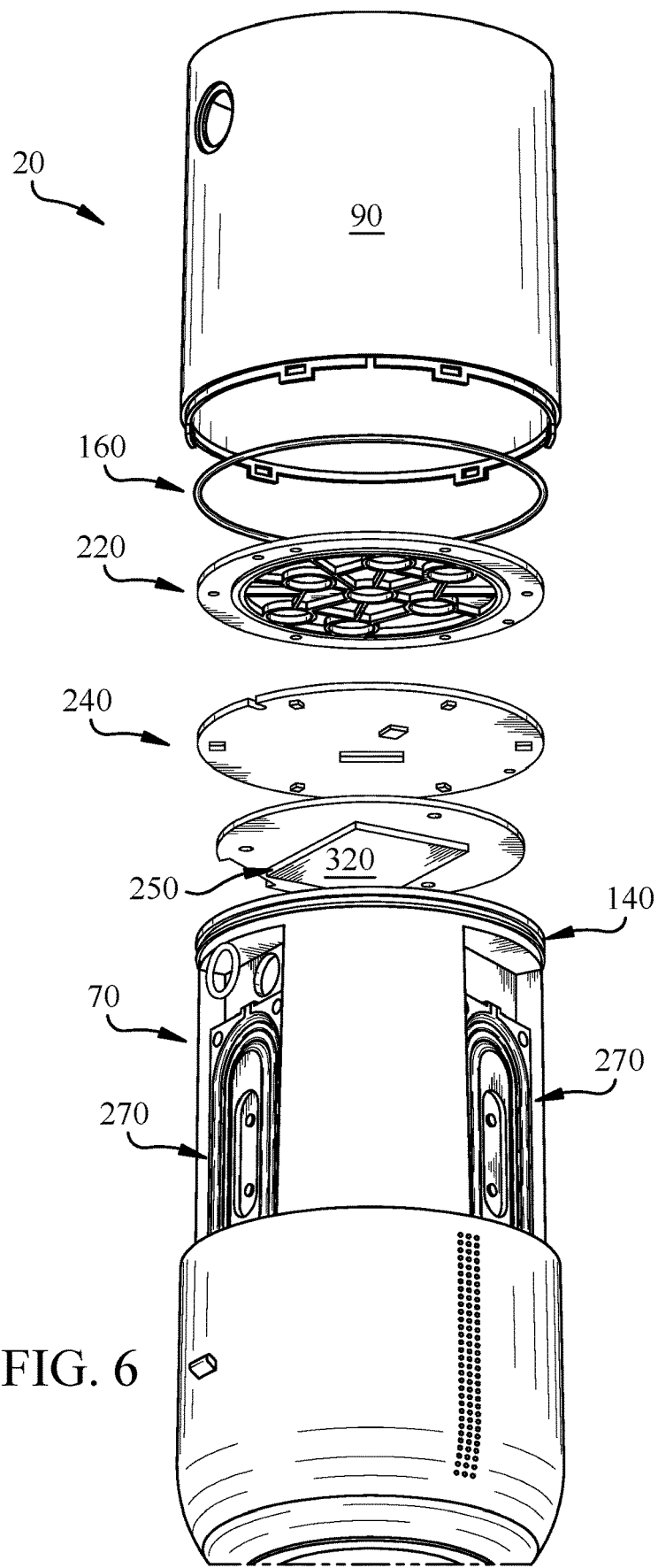
FIG. 6 shows an exploded perspective view of portions of the base of the audio device in FIG. 1.

As shown in FIG. 2, in various implementations, the control module 250 sits over the acoustic enclosure 80 in the audio device 10. The acoustic enclosure 80 is a cavity within the main body 70, which can be seen in the perspective view of the main body 70 in isolation in FIG. 5. FIG. 5 illustrates the three-dimensional space in the acoustic enclosure 80 that is defined by the main body 70. The main body 70 can include one or more slots 260 for receiving a passive radiator 270, one of which is illustrated in the cross-sectional view of FIG. 2. In some cases, a set of passive radiators 270 (e.g., three passive radiators) are arranged around the acoustic enclosure 80. With reference to FIG. 2 (and continuing reference to FIG. 5), in certain cases, the passive radiators 270 seal the slots 260 in a lower portion 280 of the acoustic enclosure 80, while a driver (i.e., transducer) 290 seals the opening 300 at the lower end 310 of the acoustic enclosure 80. FIG. 6 illustrates an exploded view of the base 20, which further illustrates the locations of the passive radiators 270 in the main body 70.

With continuing reference to FIG. 2, in various implementations, the sealing member 160 acoustically isolates the microphone(s) 185 from the driver 290, as well as the passive radiator(s) 270 positioned around the acoustic enclosure 80. That is, during audio playback from the driver 290, the passive radiators 270 are positioned to radiate in the acoustic enclosure 80. Consequently, the main body 70 is subject to acoustic vibration, such as during audio playback or in any circumstance where the passive radiators 270 radiate. When the main body 70 vibrates, the microphones 185 may fail to accurately detect ambient acoustic signals. Because the sealing member 160 helps to dampen vibration between the main body 70 and the cap 90, the sealing member 160 can help to acoustically isolate the microphone(s) 185 from the driver 290 and the passive radiator(s) 270.

FIG. 2 also illustrates a heat sink 320 that seals an upper end 330 (opposite lower end 310) of the acoustic enclosure 80 (where the upper end 330 is also illustrated in FIG. 5). In various implementations, the heat sink 320, passive radiators 270 and the driver 290 collectively seal the acoustic enclosure 80 such that the acoustic enclosure 80 is airtight (and does not include any port). In various implementations, the heat sink 320 is located under the control module 250, and includes metal or an alloy with sufficient thermal conductivity to transfer heat from the overlying control module 250 to the acoustic enclosure 80. The location of the heat sink 320 relative to the control module 250 is further illustrated in the exploded view in FIG. 6.

With continuing reference to FIGS. 2 and 3, in certain cases, the control module 250 is surrounded by a cover (e.g., a metal such as stainless steel), and a thermal interface material (e.g., a thermally conductive gel) is located between the cover for the control module 250 and the heat sink 320. As noted herein, the heat sink 320 is configured to transfer heat from the control module 250 to the acoustic enclosure 80 via conduction and convection cooling. That is, the heat from the control module 250 is drawn toward, and then conducted through, the heat sink 320, which is correspondingly cooled by the movement of air across its lower surface. Convection cooling of the heat sink 320 (via movement of air in the acoustic enclosure 80) can maintain the temperature differential between the control module 250 and the heat sink 320, such that during operation, the heat sink 320 draws heat from the control module 250 into the acoustic enclosure 80.

In some cases, the heat sink 320 is located in a slot 340 between the acoustic enclosure 80 and the electronics compartment 230. The heat sink 320 can take any shape capable of sealing the slot 340, for example, a rectangular or circular cross-sectional shape. In various implementations, the heat sink 320 has a thickness of approximately 1-3 millimeters, and in particular cases, is approximately 2 millimeters thick. In certain cases, the heat sink 320 extends laterally (e.g., radially) beyond the overlying control module 250, such that the heat sink 320 has a greater length (or, width or diameter, depending upon its shape) than the control module 250. In certain cases (not shown), the heat sink 320 can extend laterally to a cavity in the main body 70 for transferring a portion of the heat from the control module 250 to that cavity. In these cases, the heat sink 320 can have at least one lateral extension that contacts a cavity in the main body 70 that is distinct from the acoustic enclosure 80.

As noted herein, with continuing reference to FIGS. 2 and 3, the heat sink 320 is configured to transfer heat away from the control module 250 to the acoustic enclosure 80. In particular cases, during operation of the acoustic device 10, air moved by the set of passive radiators 270 within the acoustic enclosure 80 aids in the transfer of heat away from the control module 250. That is, as the passive radiators 270 move due to the acoustic output of the driver 290, that movement causes turbulence in the air within the sealed acoustic enclosure 80. This movement of air in the acoustic enclosure 80 can aid in transferring heat away from the control module 250, via the heat sink 320.

As noted herein, during use, the communication capabilities of the control module 250 cause that control module 250 to generate significant amounts of heat. However, given the centralized location of the control module 250 within the main body 70, preventing overheating of that control module 250 (and nearby components in the electronics compartment 230) presents a challenge. As also noted herein, the heat sink 320 addresses this challenge by transferring heat from the control module 250 to the acoustic enclosure 80, which is sealed internally to the main body 70. With the heat sink 320 in position as a wall of the acoustic enclosure 80, the heat sink 320 can effectively transfer heat away from the control module 250 without being thermally coupled to a location external to the main body 70. While top-down heat transfer is less efficient than bottom-up heat transfer, the proximity of the heat sink 320 to both the control module 250 and the acoustic enclosure 80 allows that heat sink 320 to effectively cool the control module 250.

It is understood that the relative proportions, sizes and shapes of the audio device 10 and components and features thereof as shown in the FIGURES included herein can be merely illustrative of such physical attributes of these components. That is, these proportions, shapes and sizes can be modified according to various implementations to fit a variety of products. For example, while a substantially tubular (or circular cross-sectional) shaped loudspeaker may be shown according to particular implementations, it is understood that the loudspeaker could also take on other three-dimensional shapes in order to provide acoustic functions described herein.

In various implementations, components described as being "coupled" to one another can be joined along one or more interfaces. In some implementations, these interfaces can include junctions between distinct components, and in other cases, these interfaces can include a solidly and/or integrally formed interconnection. That is, in some cases, components that are "coupled" to one another can be simultaneously formed to define a single continuous member. However, in other implementations, these coupled components can be formed as separate members and be subsequently joined through known processes (e.g., soldering, fastening, ultrasonic welding, bonding). In various implementations, electronic components described as being "coupled" can be linked via conventional hard-wired and/or wireless means such that these electronic components can communicate data with one another. Additionally, sub-components within a given component can be considered to be linked via conventional pathways, which may not necessarily be illustrated.

A number of implementations have been described. Nevertheless, it will be understood that additional modifications may be made without departing from the scope of the inventive concepts described herein, and, accordingly, other implementations are within the scope of the following claims.

We claim:
1. A portable audio device comprising:
    a main body defining an acoustic enclosure, the main body comprising a slot extending around an external surface thereof;
    a cap overlying the main body; and
    a sealing member extending entirely around the external surface of the main body in the slot, the sealing member providing a substantially water resistant seal between the main body and the cap, wherein the portable audio device is configured for use as at least one of a tabletop loudspeaker or a handheld loudspeaker.

2. The portable audio device of claim 1, wherein the cap is coupled with the main body by at least one snap-fit coupling, wherein the sealing member dampens a load on the at least one snap-fit coupling.

3. The portable audio device of claim 2, wherein the sealing member aids in aligning the cap with the main body.

4. The portable audio device of claim 1, wherein the slot extends circumferentially about the external surface of the main body.

5. The portable audio device of claim 1, wherein the acoustic enclosure is sealed at a lower end by a transducer.

6. The portable audio device of claim 1, further comprising:
a transducer at a lower end of the acoustic enclosure,
a heat sink at an upper end of the acoustic enclosure,
a set of passive radiators at a lower portion of the acoustic enclosure, and
at least one microphone mounted in the main body above the heat sink, wherein the sealing member acoustically isolates the at least one microphone from the transducer and the set of passive radiators.

7. The portable audio device of claim 1, wherein the acoustic enclosure is airtight.

8. The portable audio device of claim 7, further comprising an electronics compartment over the acoustic enclosure in the main body.

9. The portable audio device of claim 1, further comprising an electronics compartment over the acoustic enclosure in the main body, wherein the acoustic enclosure is sealed at a lower portion by a set of passive radiators and is sealed at an upper end by a heat sink, wherein the electronics compartment comprises a control module, wherein the heat sink is configured to transfer heat away from the control module to the acoustic enclosure, and wherein during operation of the acoustic device, air moved by the set of passive radiators within the acoustic enclosure aids in the transfer of heat away from the control module.

10. The portable audio device of claim 1, wherein the sealing member aligns the cap with the main body, and wherein the sealing member provides impact protection for components housed in the main body.

11. The portable audio device of claim 1, wherein the substantially water resistant seal is capable of achieving at least IPX7 liquid ingress protection.

12. The portable audio device of claim 1, wherein the cap extends along a sidewall of the main body at least a portion of an axial length of the acoustic enclosure.

13. The portable audio device of claim 1, wherein the sealing member contacts an inner surface of the cap.

14. A portable audio device comprising:
a main body defining an acoustic enclosure, the main body comprising a slot extending circumferentially around an external surface thereof;
a cap overlying the main body; and
a sealing member extending entirely around the external surface of the main body in the slot, the sealing member providing a substantially water resistant seal between the main body and the cap, wherein the sealing member aligns the cap with the main body, and wherein the sealing member provides impact protection for components housed in the main body, wherein the portable audio device is configured for use as at least one of a tabletop loudspeaker or a handheld loudspeaker.

15. The portable audio device of claim 14, wherein the cap is coupled with the main body by at least one snap-fit coupling, wherein the sealing member dampens a load on the at least one snap-fit coupling, wherein the sealing member aids in aligning the cap with the main body, and wherein the sealing member provides a contact point for the cap to aid in stabilizing the cap over the main body.

16. The portable audio device of claim 14, wherein the acoustic enclosure is sealed at a lower end by a transducer, is sealed at a lower portion by a set of passive radiators and is sealed at an upper end by a heat sink.

17. A portable audio device comprising:
a main body defining: an acoustic enclosure, and an electronics compartment over the acoustic enclosure, the main body comprising a slot extending around an external surface thereof;
a cap overlying the main body; and
a sealing member extending entirely around the external surface of the main body in the slot, the sealing member providing a substantially water resistant seal between the main body and the cap, wherein the sealing member contacts an inner surface of the cap, wherein the portable audio device is configured for use as at least one of a tabletop loudspeaker or a handheld loudspeaker.

18. The portable audio device of claim 17, further comprising:
a control module in the electronics compartment;
a set of passive radiators sealing a lower portion of the acoustic enclosure; and
a transducer sealing a lower end of the acoustic enclosure.

19. The portable audio device of claim 1, wherein the sealing member provides a contact point for the cap to aid in stabilizing the cap over the main body.

20. The portable audio device of claim 1, further comprising a handle coupled with the main body.

* * * * *